United States Patent
Schicht

Patent Number: 6,163,863
Date of Patent: Dec. 19, 2000

[54] METHOD AND CIRCUIT FOR COMPRESSING TEST DATA IN A MEMORY DEVICE

[75] Inventor: Steven F. Schicht, Boise, Id.

[73] Assignee: Micron Technology, Inc., Boise, Id.

[21] Appl. No.: 09/083,956

[22] Filed: May 22, 1998

[51] Int. Cl.⁷ ........................................... G11C 29/00
[52] U.S. Cl. ............................. 714/718; 365/201
[58] Field of Search ......................... 714/718, 710, 714/711, 42; 365/200, 201

[56] References Cited

U.S. PATENT DOCUMENTS

| | | | |
|---|---|---|---|
| 5,913,928 | 6/1999 | Morzano | 714/710 |
| 5,936,901 | 8/1999 | Wong et al. | 365/201 |
| 5,999,450 | 12/1999 | Dallabora et al. | 365/185.09 |
| 6,002,620 | 12/1999 | Tran et al. | 365/200 |
| 6,018,811 | 1/2000 | Merritt | 714/711 |
| 6,032,274 | 2/2000 | Manning | 714/718 |

*Primary Examiner*—Albert De Cady
*Assistant Examiner*—Shelly A Chase
*Attorney, Agent, or Firm*—Dorsey & Whitney LLP

[57] ABSTRACT

A test circuit in a memory device includes test data read paths and test data write paths for performing data compression to more quickly test the memory cells in the memory device. The memory device includes first and second banks of memory cells having a redundancy plane defined between the two banks and including at least one data terminal. The test circuit includes a test mode terminal adapted to receive a test mode signal, and a test data write path coupled to a plurality of memory cells in the first and second banks. The test circuit further includes a first test data read path coupled to a plurality of memory cells in the first bank, and a second test data read path coupled to a plurality of memory cells in the second bank. A test data write circuit is coupled to the data terminal and to the test data write path and transfers test data placed on the data terminal over the test data write path to a plurality of memory cells in the first and second banks. A test data read circuit is coupled to the first and second test data read paths. The test data read circuit drives a first error signal active when data on the first test data read path is different from predetermined binary values. The test data read circuit drives a second error signal active when the data on the second test data read path is different from predetermined binary values.

36 Claims, 8 Drawing Sheets

METHOD AND CIRCUIT FOR COMPRESSING TEST DATA IN A MEMORY DEVICE

TECHNICAL FIELD

The present invention relates generally to the testing of semiconductor memories, and more specifically to a method and circuit for transferring compressed read and write test data across corresponding test data paths to reduce the test time of a semiconductor memory.

BACKGROUND OF THE INVENTION

During the manufacture of semiconductor memories, such as a synchronous dynamic random access memories ("SDRAMs"), it is necessary to test each memory cell to ensure it is operating properly. Electronic and computer systems containing semiconductor memories also normally test the memories when power is initially applied to the system. A typical SDRAM includes a number of arrays, each array including a number of memory cells arranged in rows and columns. During testing of the SDRAM, each memory cell must be tested to ensure it is operating properly. To test the memory cells, a memory tester applies address, data, and control signals to the SDRAM to write data to and read data from all the memory cells in the arrays. In a typical prior art test method, data having a first binary value (e.g, a "1") is written to and read from all memory cells in the arrays, and thereafter data having a second binary value (e.g., a "0") is typically written to and read from the memory cells. The memory tester determines a memory cell is defective when the data written to the memory cell does not equal the data read from the memory cell. As understood by one skilled in the art, other test data patterns may be utilized in testing the memory cells, such as an alternating bit pattern 101010 . . . written to the memory cells in each row of the array.

Figure 1:
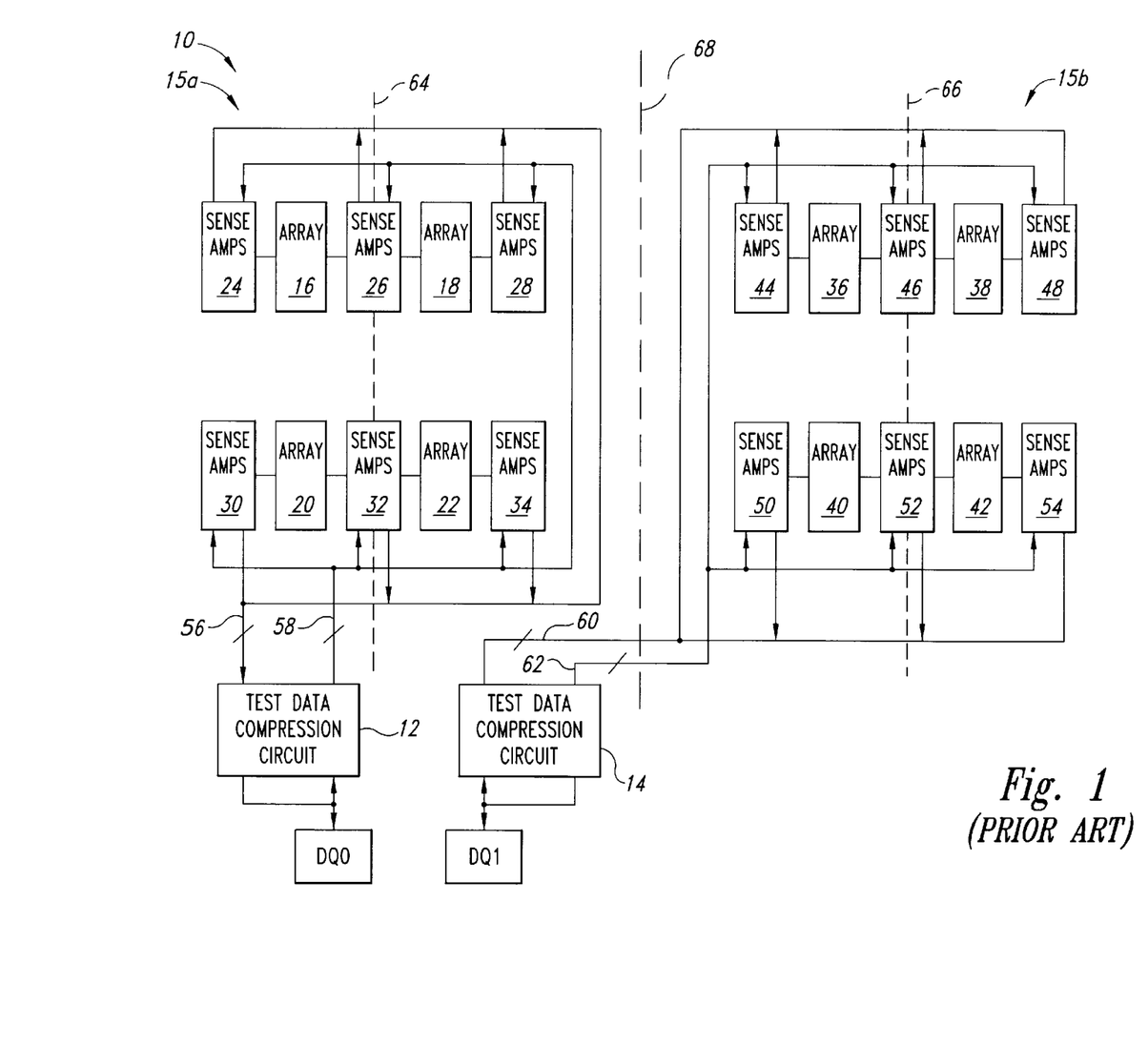
FIG. 1 is a block diagram of a portion of a memory device including conventional test data compression circuitry.

As the storage capacity of SDRAMs increases, the number of data transfers performed in testing every memory cell increases accordingly. Each data transfer requires a bus cycle, and the greater the number of bus cycles the greater the time and thus the cost of testing the SDRAM. Data compression has been used in some SDRAMs to reduce the number of bus cycles required to test the memory cells. FIG. 1 is a block diagram of a portion of a conventional SDRAM 10 including conventional test data compression circuits 12 and 14. The SDRAM 10 includes first and second memory banks 15a and 15b including two groups of arrays 16–22 and 36–42, respectively, each array including a plurality of memory cells (not shown in FIG. 1) arranged in rows and columns, as known in the art. In memory bank 15a, a plurality of sense amplifier circuits 24–34 are coupled to the arrays 16–22. The sense amplifier circuits 24–34 sense and store the data contained in activated memory cells in the associated one of the arrays 16–22, as understood by one skilled in the art. The memory bank 15b similarly includes sense amplifier circuits 44–54 coupled to the arrays 36–42. The SDRAM 10 includes two data terminals DQ0 and DQ1 physically located adjacent the memory bank 15a. The test data compression circuit 12 is coupled between the data terminal DQ0 and the sense amplifier circuits 24–34 in memory bank 15a. More specifically, the test data compression circuit 12 is coupled to each of the sense amplifier circuits 24–34 through test data read lines 56 and test data write lines 58. In the same way, the test data compression circuit 14 is coupled to the sense amplifier circuits 44–54 of memory bank 15b through test data read lines 60 and test data write lines 62.

In operation during testing of the SDRAM 10, a memory tester (not shown in FIG. 1) places the SDRAM 10 in a test mode of operation. In the test mode, the test data compression circuits 12 and 14 each operate in two modes, a test data write mode and a test data read mode. In the test data write mode, the test data compression circuit 12 transfers test data placed on the data terminal DQ0 across the test data write lines 58 and through the corresponding sense amplifier circuits to activated memory cells in the arrays 16–22. For example, if the arrays 16 and 20 are active, the test data placed on the data terminal DQ0 is transferred through the appropriate one of the sense amplifier circuits 24 and 26 to an activated memory cell in the array 16, and is simultaneously transferred through the appropriate one of the sense amplifier circuits 30 and 32 to an activated memory cell in the array 20. The test data compression circuit 14 operates in the same way to transfer test data placed on the data terminal DQ1 over the test data write line 62 to the activated memory cells in the arrays 36–42.

In the test data read mode, the test data compression circuit 12 receives test data placed on the test data read lines 56 from activated memory cells in the arrays 16–22. If the arrays 16 and 20 are active, data stored in an accessed memory cell in array 16 and an accessed cell in array 20 is transferred over the test data read lines 56 to the compression circuit 12. The test data compression circuit 12 compares the test data on the test data read lines 56 and places an error signal on the data terminal DQ0 indicating the result of that comparison. Typically, the same binary value is written to all memory cells during the test data write mode, and the error signal indicates if any of the activated memory cells stores a different binary value. The circuit 14 operates in the same way to compare data stored in bank 15b and place and error signal on the terminal DQ1. The memory tester monitors the states of the error signals on the data terminals DQ0 and DQ1 to detect defective memory cells in the memory banks 15a and 15b, respectively.

If the memory tester detects a defective memory cell, the row of memory cells containing the defective cell is replaced using redundant rows of memory cells contained in the SDRAM 10, as understood by those skilled in the art. When using data compression, however, the precise memory cell that is defective is not immediately known by the memory tester. For example, if the active memory cells are in the arrays 16 and 20 and one of these active memory cells is defective, the test data compression circuit 12 drives the error signal on the data terminal DQ0 to a level telling the memory tester that one, but not which one, of the activated memory cells is defective. In order to determine which of the arrays 16 and 20 contains the defective memory cell, the memory tester must perform additional tests on the cells. Such additional testing may include individually writing data to and reading data from the memory cells to determine which of the two is defective.

Additional testing by the memory tester adds to the time and thus the expense of testing the SDRAM 10, and is accordingly undesirable. As a result, it is typically advantageous to simply replace rows in both arrays when a defective memory cell is detected. Although this increases the number of redundant rows needed in the SDRAM 10, the reduced test time and resulting cost savings typically outweigh additional space required for the additional redundant rows. The data from too many arrays cannot be compressed, however, or else the advantages of reduced testing time are outweighed by the extra rows unnecessarily replaced in the additional arrays.

In order to avoid unnecessarily utilizing redundant rows of memory cells, the memory banks 15a and 15b are partitioned by defining "redundancy planes" within and between the memory banks. A redundancy plane defines a group of arrays having their data compressed together. For example, in memory bank 15a the dotted line 64 defines a redundancy plane between the arrays 16,20 and 18,22, and in memory bank 15b the dotted line 66 defines a redundancy plane between the arrays 36,40 and 38,42. The redundancy plane defined by the dotted line 64 indicates that the data from the arrays 16 and 20 will be compressed together, and the data from the arrays 18 and 22 will likewise be compressed together. The data from arrays on opposite sides of a redundancy plane, such as arrays 16 and 18, are not compressed together. In this way, the number of arrays having their data compressed is limited to the number of arrays within a particular redundancy plane. In the SDRAM 10, the redundancy planes defined by the dotted lines 64 and 66 are naturally defined due to the sharing of the sense amplifier circuits by the arrays in each row, as understood by one skilled in the art. A redundancy plane indicated by the dotted line 68 is also defined between the memory banks 15a and 15b. Once again, this means that data from the memory bank 15a is not compressed with data from the memory bank 15b. Thus, a defective memory cell in one of the arrays in memory bank 15a does not result in rows being replaced in any of the arrays in the memory bank 15b.

In order to partition the SDRAM 10 into the desired redundancy planes, the routing of the test data read lines 56,60 and test data write lines 58,62 may become difficult. This is particularly true of the so called "H-Architecture" depicted in FIG. 1, where the line 68 corresponds to the horizontal member of the "H" and each row of arrays corresponds to a vertical member of the "H." In the H-Architecture, the data terminals DQ are typically positioned adjacent the arrays in one of the banks as shown. As a result, the length of the lines 56–62 connecting the data terminals DQ and the arrays may become undesirably long. For example, as the number of arrays in each row increases the length of the lines 56,58 between the circuit 12 the arrays in the upper row of bank 15a becomes longer, as do the lines 60,62 coupled between the circuit 14 and the arrays in bank 15b. In addition, the routing of the lines 56–62 may become increasingly difficult as the density of the SDRAM 10 increases due to reduced spaces in which to position such lines. Furthermore, as more arrays are added to the memory banks 15a and 15b, the electrical characteristics of the test data read lines 56,60 and test data write lines 58,62 may differ substantially from those of the normal test data read and test data write paths. This is undesirable because the electrical characteristics of the SDRAM 10 in the test mode are ideally the same as those when operating in the normal mode in order to perform reliable testing of the SDRAM 10.

There is a need for a test circuit having simplified test data read and test data write paths for testing memory cells in an SDRAM.

SUMMARY OF THE INVENTION

A test circuit in a memory device tests for defective memory cells. The memory device includes first and second banks of memory cells having a redundancy plane defined between the two banks, and includes at least one data terminal. The test circuit comprises a test mode terminal adapted to receive a test mode signal. A test data write path is coupled across the redundancy plane to a plurality of memory cells in the first and second banks. A test data write circuit is coupled to the test mode and data terminals, and to the test data write path. The test data write circuit operates in a test write mode when the test mode signal is active to transfer test data placed on the data terminal across the redundancy plane through the test data write path, storing the test data in a plurality of memory cells in the first and second banks.

Another aspect of the inventive test circuit further includes a first test data read path coupled to a plurality of memory cells in the first bank, and a second test data read path coupled to a plurality of memory cells in the second bank. A test data read circuit is coupled to the first and second test data read paths. The test data read circuit drives a first error signal active when data on the first test data read path is different from predetermined binary values, and drives a second error signal active when data on the second test data read path is different from predetermined binary values. When the test mode signal is active, a test control circuit controls operation of the test circuit to test memory cells in the memory device.

DETAILED DESCRIPTION OF THE INVENTION

Figure 2A:
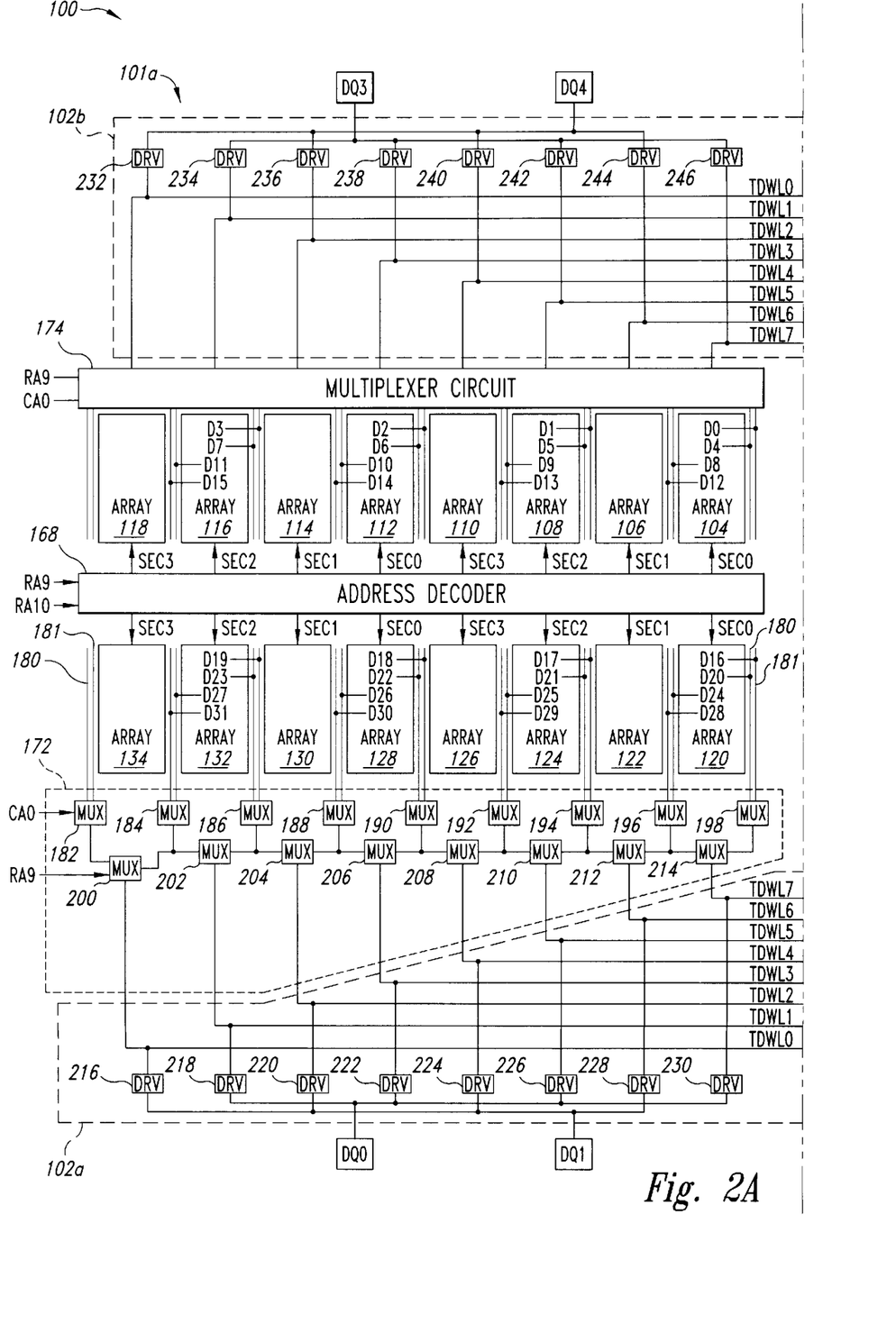
FIGS. 2A and 2B are a block diagram of a portion of a memory device including write compression circuitry according to one embodiment of the present invention.
Figure 2B:
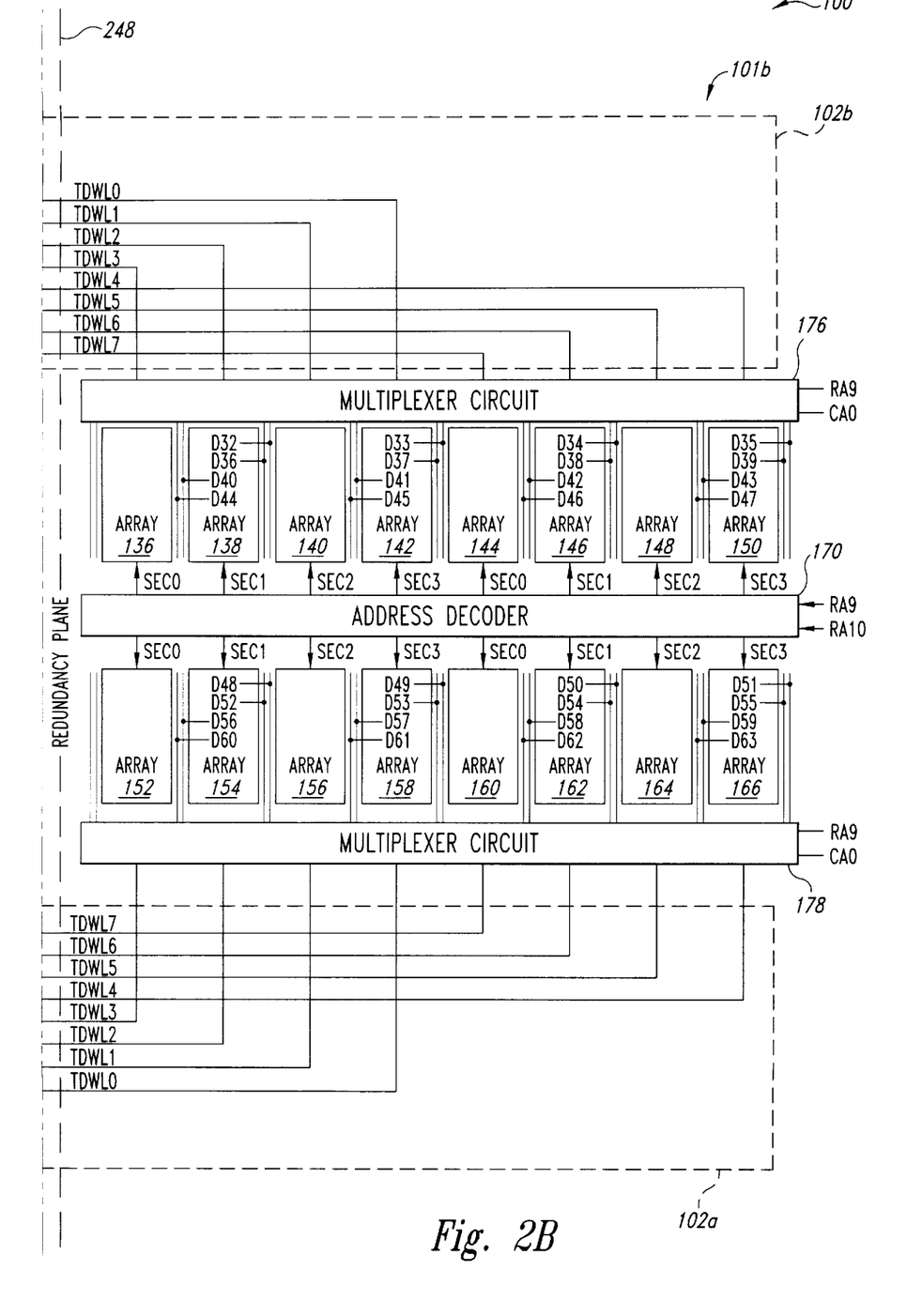

FIGS. 2A and 2B are a block diagram of a portion of an SDRAM 100 including write compression circuitry 102, designated 102a and 102b, according to one embodiment of the present invention. The FIGS. 2A and 2B will be collectively referred to as FIG. 2 hereinafter. Although the described embodiment of the present invention is contained in an SDRAM 100, it may be included in other types of memories as well, such as DRAMs, SRAMs, and SLDRAMs. In the embodiment of FIG. 2, the SDRAM 100 includes four data terminals DQ0–DQ3, and the write compression circuits 102a and 102b operate during a test write mode to transfer a single bit of test data placed on each of the data terminals DQ0–DQ3 into eight memory cells in the SDRAM 100, as will be explained in more detail below. In this way, the write compression circuits 102a and 102b reduce the time it takes to write test data into all the memory cells in the SDRAM 100.

The SDRAM 100 includes a first memory bank 101a including arrays 104–134, and a second memory bank 101b including arrays 136–166, each of the arrays 104–166 including a plurality of memory cells arranged in rows and columns. A redundancy plane designated by the line 248 is defined between the memory banks 101a and 101b and, although not shown, redundancy planes are defined within each bank between even and odd-numbered arrays. A number of memory cells in the even-numbered arrays are represented through the lines labeled D0–D63, and will be used later in explaining the operation of the write compression circuits 102a and 102b. An address decoder 168 receives address signals RA9 and RA10 from address decode circuitry (not shown in FIG. 2) in the SDRAM 100. The address decoder 168 decodes the address signals RA9 and RA10 and outputs decoded address signals SEC0–SEC3 to the arrays 104–134 as shown. The address decoder 168 operates in two modes, a normal mode and a test mode. In normal mode, the decoder 168 activates one of the decoded address signals SEC0–SEC3 in response to the address signals RA9 and RA10 to thereby activate the associated ones of the arrays 104–134. For example, when the address signals RA9 and RA10 are both binary 0, the address decoder 168 activates the signals SEC0 which, in turn, activates the arrays 104, 112, 120, and 128. In test mode, whenever the signal RA9 is low the decoder 168 activates signals SEC0, SEC2, and when the signal RA9 is high the decoder 168 activates signals SEC1, SEC3. An address decoder 170 operates in the same way to activate the arrays 136–166 in memory bank 101b.

The SDRAM 100 further includes four multiplexer circuits 172–178. Each of the multiplexer circuits 172–178 is identical so, for the sake of brevity, only the multiplexer circuit 172 will be discussed in more detail. The multiplexer circuit 172 is coupled to the arrays 120–134 through pairs of I/O lines 180,181 disposed on both sides of each of the arrays 120–134. Each of the I/O lines 180,181 typically includes complementary signals as understood by one skilled in the art, and a single line is shown for each of the I/O lines 180,181 merely for ease of explanation. In FIG. 2, the memory cells D16–D31 in the arrays 120, 124, 128, and 132 are shown connected directly to the I/O lines 180,181 adjacent these arrays. One skilled in the art will realize that the interconnection of the memory cells D16–D31 is typically through other conventional circuitry, such as I/O transistors and sense amplifiers adjacent the arrays, which have been omitted for the sake of brevity.

The pairs of I/O lines 180,181 are coupled respectively to multiplexers 182–198 in the multiplexer circuit 172. Each of the multiplexers 182–198 receives a column address signal CA0, which is only shown for the multiplexer 182. In response to the column address signal CA0, each of the multiplexers 182–198 couples one of the associated I/O lines 180,181 to an input. When the signal CA0 is high, each of the multiplexers 182–198 couples the I/O line 180 to its input, and couples the I/O line 181 to its input when the signal CA0 is low. The input of each of the multiplexers 182–198 is coupled to the output of two adjacent multiplexers 200–214 as shown. This is true except for the multiplexers 182 and 198, which have their inputs coupled to only a signal output of the adjacent multiplexers 200 and 214, respectively. The multiplexers 200–214 each receive a row address signal RA9, which is only shown for the multiplexer 200. In response to the signal RA9, each of the multiplexers 200–214 operates in the same way as the multiplexers 182–198 to couple its input to one of its outputs. When the signal RA9 is high, each of the multiplexers couples its left output to its input, and couples its right output to its input when the signal CA0 is low. For example, when the signal RA9 is low, the multiplexer 200 couples its input to the multiplexer 184.

The inputs of the multiplexers 200–214 are coupled to outputs of a number of write drivers 216–230, respectively. The write drivers 216,220,224, and 228 have their inputs coupled to the data terminal DQ1, and the drivers 218, 222, 226, and 230 have their inputs coupled to the terminal DQ0. Each of the write drivers 216–230 develops a signal on its output having the same logic level as a signal applied on its input. The outputs of the write drivers 216–230 are further coupled through a number of test data write lines TDWL0–TDWL7, respectively, to multiplexers (not shown) in the multiplexer circuit 178 corresponding to the multiplexers 200–214 in the multiplexer circuit 172. The write compression circuit 102b similarly includes write drivers 232–246 having inputs coupled to the data terminals DQ2 and DQ3 and outputs coupled to the multiplexer circuits 174 and 176 through test data write lines TDWL0–TDWL7 as shown. The multiplexers 182–214 and write drivers 216–230 are all conventional circuits, and understood by one skilled in the art.

In operation during the write test mode, the external circuit applies address and control signals to the SDRAM 100 as well as test data on the data terminals DQ0–DQ3. In response to the address and control signals, address decode circuitry, which includes the address decoders 168 and 170 as well as the multiplexer circuits 172–178, decode the address signals and activate corresponding memory cells in the arrays 104–166. An example of the operation of the write compression circuit 102a will now be described in more detail. In the example, the address signals RA9 and CA0 are assumed to be low. In response to the low signal RA9, the decoder 168 activates the signals SEC0 and SEC2 and thereby activates the arrays 104,108,112,116, and 120,124, 128,132 in memory bank 101a. Similarly, the address decoder 170 activates the signals SEC0 and SEC2 and thereby activates the arrays 136,140,144,148 and 152,156, 160,164 in memory bank 101b. Within each of the activated arrays, the illustrated memory cells are assumed to be accessed. For example, in the array 120 the memory cells D16,D20,D24, and D28 are accessed.

After the addressed memory cells in the activated arrays have been accessed, the test data placed in the terminals DQ0 and DQ1 by the external circuit is transferred through the write drivers 216–230 to the associated ones of the multiplexers 200–214. For example, the test data placed on the data terminal DQ1 is transferred through the write driver 216 to the multiplexer 200 which, in turn, transfers the data through the multiplexer 184 and over the I/O line 181 to the memory cell D27 in the array 132. In the same way, the test data placed on the data terminal DQ1 is transferred through the write drivers 220,224, and 228 and through the associated multiplexers to the memory cells D24, D25, and D26 in the arrays 120,124, and 128, respectively. In addition, the test data placed on the terminal DQ1 and output by the write drivers 216,220,224, and 228 is transferred over the test data lines TDWL0,TDWL2,TDWL4, and TDWL6, respectively, to the multiplexer circuit 178. The multiplexer circuit 178 transfers the test data on the test data lines TDWL0,TDWL2, TDWL4, and TDWL6 to the memory cells D56–D59 in the activated arrays 152,156,162,164, in the same way as is previously described for the multiplexer circuit 172. Thus, a single bit of test data placed on the data terminal DQ1 is simultaneously written to the eight memory cells D24–D27 and D56–D59. In the same way, a bit of test data on each of the terminals DQ0, DQ2, and DQ3 is transferred into eight memory cells in activated arrays. The external circuit writes test data into all of the memory cells in the arrays 104–166 by applying address and control signals to the SDRAM 100 and placing test data on the data terminals DQ0–DQ3.

The write compression circuits 102a and 102b write data placed on a particular one of the data terminals DQ0–DQ4 into memory cells in both the memory banks 101a and 101b.

Thus, although the redundancy plane 248 is defined between the banks 101*a* and 101*b,* test data is nonetheless written across the redundancy plane. By writing the test data across the redundancy plane 248, the test data write path comprising the test data write lines TDWL0–TDWL7 is greatly simplified and the lengths of such write lines reduced. In the H-Architecture of FIG. 2, if test write data was compressed only within the banks 101*a* and 101*b,* the test data write path would be much more complicated. For example, the data terminal DQ0 would need to be coupled to the group of arrays 104–118 in bank 101*a*. Such long test data write lines cause the electrical characteristics of the test data write path to undesirably deviate from those of the normal test data write path as previously discussed.

Figure 3:
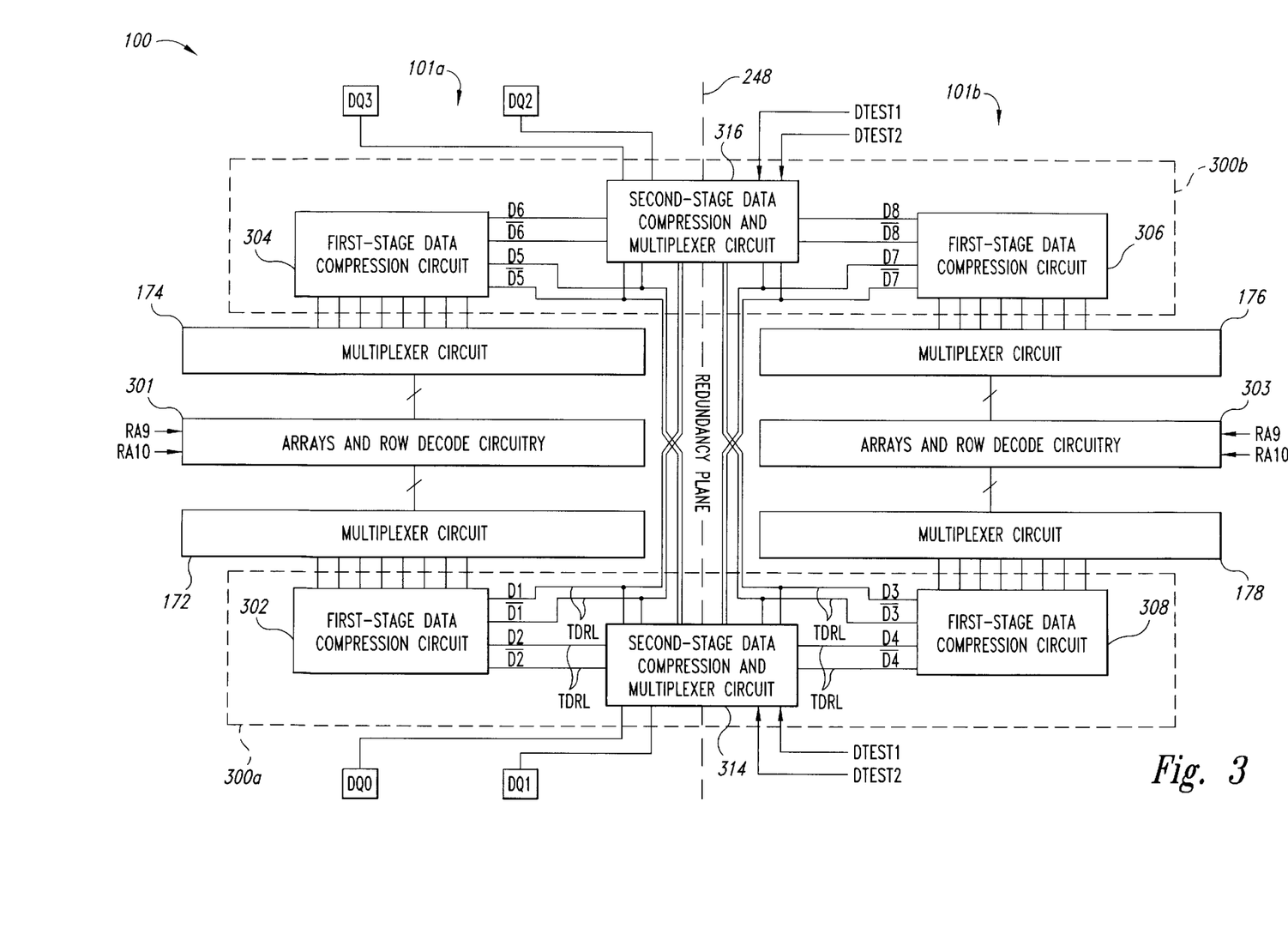
FIG. 3 is a block diagram of a portion of a memory device including read compression circuitry according to one embodiment of the present invention.

FIG. 3 is a block diagram of a portion of the SDRAM 100 including read compression circuits 300*a* and 300*b* according to one embodiment of the present invention. The arrays 104–166 and row decoders 168 and 170 have been represented by the boxes 301 and 303 in the arrays 101*a* and 101*b,* respectively. The circuits 301 and 303 along with the multiplexer circuits 172–178 are the same as previously described with reference to FIG. 2, and for the sake of brevity will not be described in further detail. During a read test data mode, the read data compression circuits 300*a* and 300*b* compress data stored in activated memory cells in the arrays 104–166 and develop respective error signals on the data terminals DDQ-DQ3 in response to the compressed data, as will be explained in more detail below.

The read data compression circuit 300*a* includes two first-stage data compression circuits 302 and 308 receiving data from the multiplexer circuits 172 and 178, respectively. Although the multiplexer circuits 172–178 are identical to those previously described in FIG. 2, one skilled in the art will realize the multiplexer circuits transfer data in the opposite direction when operating with the read compression circuits 300*a* and 300*b*. For example, during the read test data mode the multiplexer circuit 172 transfers data stored in the arrays 120–134 through the multiplexers 182–198 (see FIG. 2) and then through the multiplexers 200–214 (see FIG. 2) to provide eight bits of test data to the first-stage data compression circuit 302. The circuit 302 compresses data received from the multiplexer circuit 172, and outputs first and second pairs of compressed data signals D1,$\overline{D1}$ and D2,$\overline{D2}$ in response to the compared data, as will be explained in more detail below.

Figure 4:
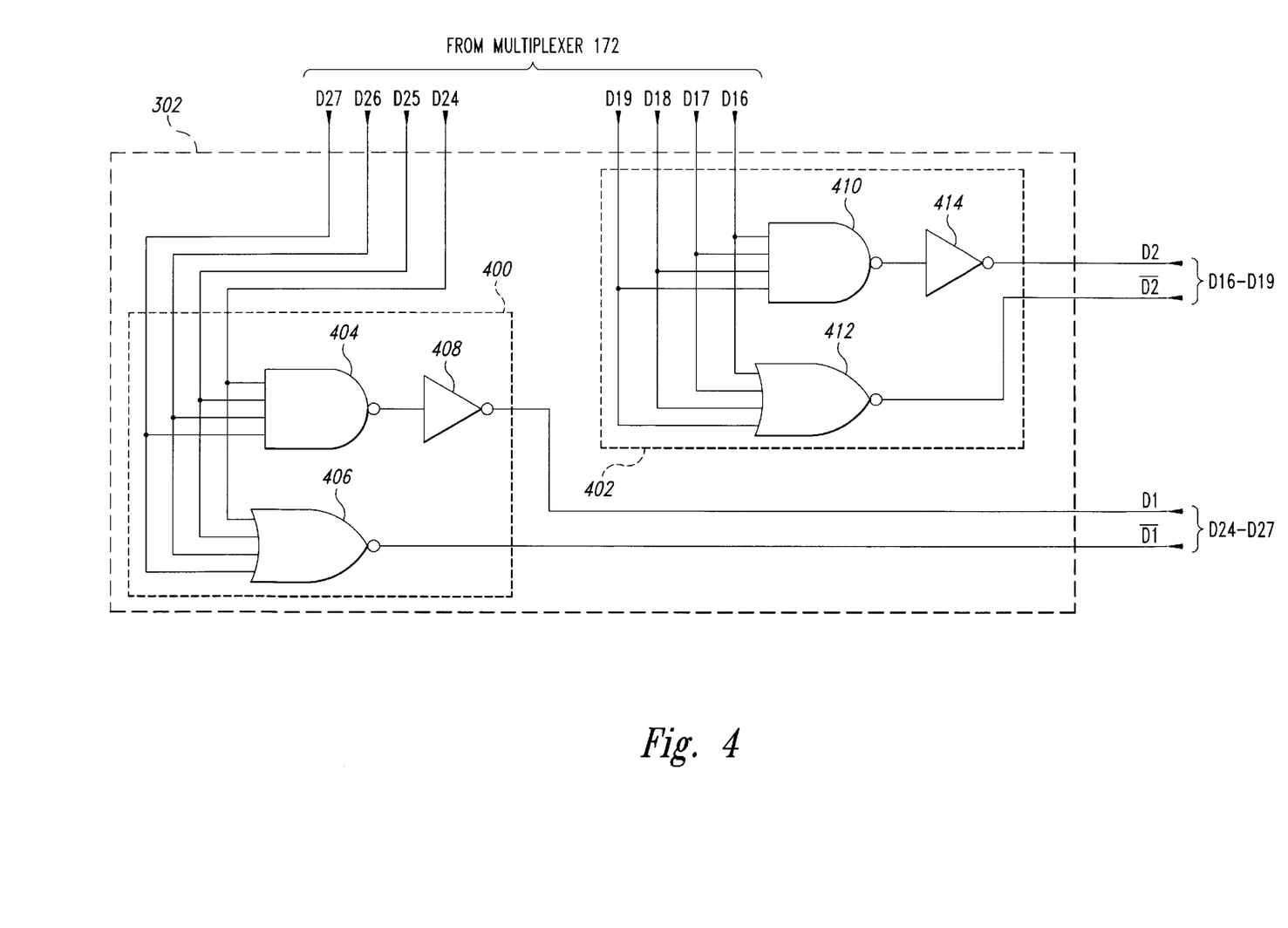
FIG. 4 is a schematic of one of the first-stage data compression circuits of FIG. 3.

FIG. 4 is a schematic of one embodiment of the first-stage data compression circuit 302 including a first error detection circuit 400 and second error detection circuit 402 each receiving four data signals. More specifically, the first error detection circuit 400 includes a NAND gate 404 and a NOR gate 406 each including four inputs receiving respective data signals. The output of the NAND gate 404 is coupled through an inverter 408 to develop the compressed data signal D1, and the output of the NOR gate 406 develops the complementary compressed data signal $\overline{D1}$. The second error detection circuit 402 includes a NAND gate 410, NOR gate 412, and inverter 414 coupled in the same way as the corresponding components in the first error detection circuit 400 to develop the complementary compressed data signals D2,$\overline{D2}$.

In operation, the error detection circuits 400 and 402 each compare the binary values of the data signals applied on their inputs and develop the compressed data signals D1,$\overline{D1}$ and D2,$\overline{D2}$, respectively, in response to these data signals. In the following description, assume the arrays 120, 124, 128 and 132 are activated such that the multiplexer circuit 172 applies the data signals D24–D27 and D16–D19 to the first and second error detection circuits 400 and 402, respectively, as shown in FIG. 4. More specifically, for the error detection circuit 402, the data signals D16–D19 are applied on respective inputs of the NAND gate 410 and NOR gate 412. When the data signals D16–D19 are all high, the output of the NAND gate 410 goes low driving the signal D2 high through the inverter 414. In response to the high data signals D16–D19, the output of the NOR gate 412 drives the signal $\overline{D2}$ low. Thus, when the data signals D16–D19 are all high, the error detection circuit 402 drives the data signals D2 and $\overline{D2}$ high and low, respectively. If the data signals D16–D19 are all low, the NAND gate 410 and NOR gate 412 operate in a similar manner to drive the data signals D2 and $\overline{D2}$ low and high, respectively.

When the data signals D16–D19 do not all have the same binary value, the circuit 402 drives both data signals D2 and $\overline{D2}$ low. For example, assume the data signals D16–D18 are all high and the data signal D19 is low. In this situation, the NAND gate 410 drives its output high and the inverter 414, in turn, drives the data signal D2 low, and the NOR gate 412 likewise drives the data signal $\overline{D2}$ low. Thus, when the data signals D16–D19 do not all have the same binary values, both the compressed data signals D2 and $\overline{D2}$ go low. In this way, if the same binary value of data is written to the memory cells D16–D19, the error detection circuit 402 detects when one of the memory cells storing the data D16–D19 is defective by driving the signals D2,$\overline{D2}$ low. The error detection circuit 400 operates in the same way to develop the compressed data signals D1,$\overline{D1}$ in response to the data signals D24–D27 and thereby detects whether any of the corresponding memory cells is defective. Referring back to FIG. 3, the first-stage data compression circuits 304–308 operate in the same way in response to data signals output by the multiplexer circuits 174–178, respectively, to develop pairs of complementary data signals D3,$\overline{D3}$–D8,$\overline{D8}$ as shown.

The data signals D1,$\overline{D1}$–D8,$\overline{D8}$ developed by the circuits 302–308 are transferred over test data read lines TDRL to second-stage data compression and multiplexer circuits 314 and 316 as shown. Each of the circuits 314 and 316 receives two control signals DTEST1 and DTEST2 from control circuits (not shown in FIG. 3) in the SDRAM 100. In response to the control signals DTEST1 and DTEST2, each of the circuits 314 and 316 operates to either further compress the received data signals or as a multiplexer circuit, as will be described in more detail below.

Figure 5:
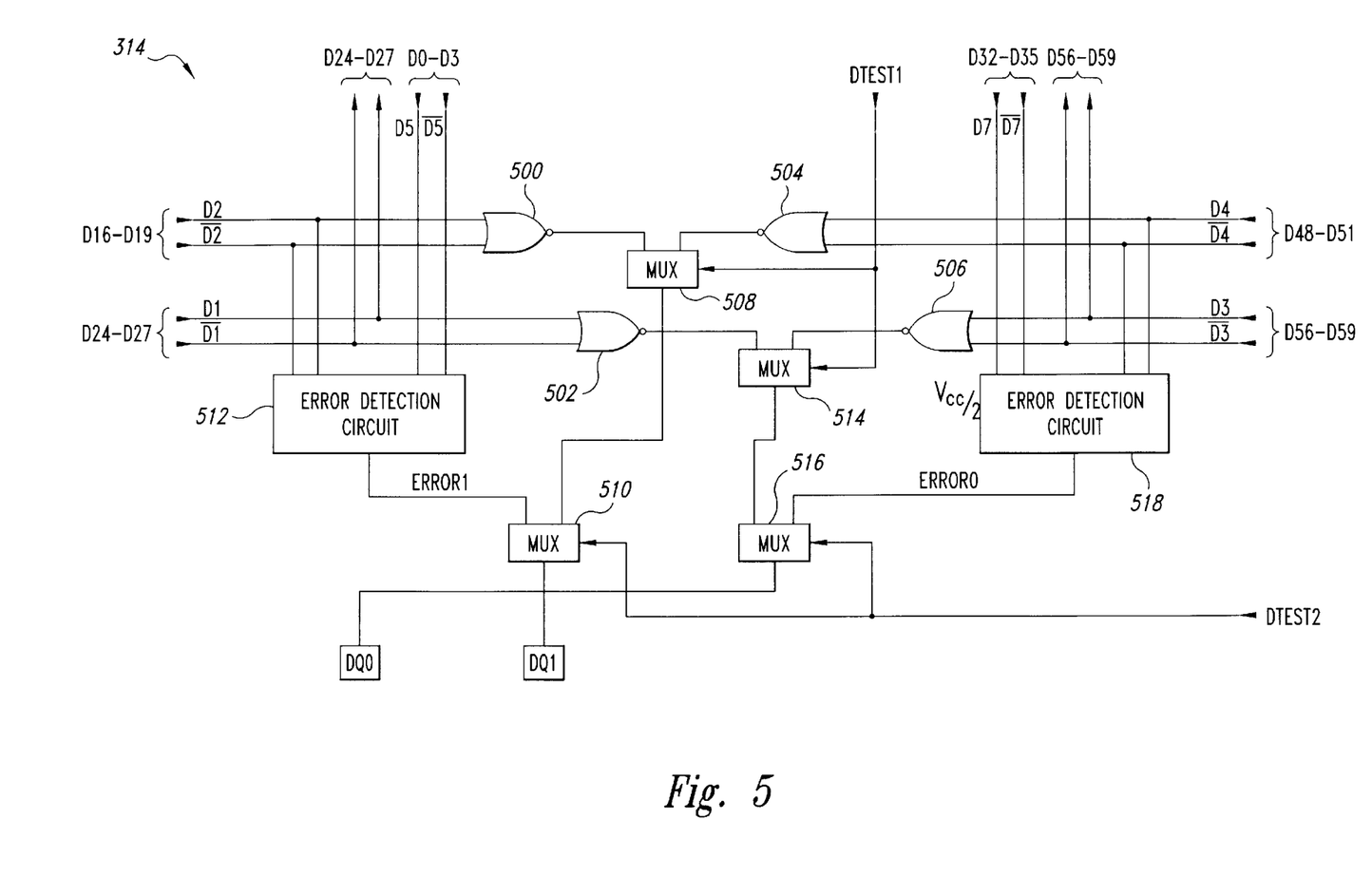
FIG. 5 is a schematic block diagram of one of the second-stage data compression and multiplexer circuits of FIG. 3.

FIG. 5 is a more detailed schematic of the second-stage data compression and multiplexer circuit 314 including first and second NOR gates 500 and 502 receiving the compressed data signals D2,$\overline{D2}$ and D1,$\overline{D1}$, respectively, from the first-stage data compression circuit 302. The NOR gates 500 and 502 develop error signals on their respective outputs in response to the signals D2,$\overline{D2}$ and D1,$\overline{D1}$, respectively. When the signal D2 and $\overline{D2}$ are high and low, or low and high, the NOR gate 500 drives the error signal on its output inactive low. If both signals D2 and $\overline{D2}$ are low, however, which indicates one of the memory cells storing data compressed to develop the signals D2,$\overline{D2}$, the NOR gate 500 drives the error signal on its output active high. The NOR gate 502 operates the same way in response to the signals D1 and $\overline{D1}$, driving the error signal on its output active high when a defective memory cell is present. The circuit 314 further includes third and fourth NOR gates 504 and 506 receiving compressed data signals D4,$\overline{D4}$ and D3,$\overline{D3}$, respectively, from the first-stage data compression circuit 308 (See FIG. 3). The NOR gates 504 and 506 operate in the same way as the NOR gates 500 and 502, developing error signals on their outputs in response to the compressed data signals D4,$\overline{D4}$ and D3,$\overline{D3}$ on their inputs.

The outputs of the NOR gates 500 and 504 are coupled to respective inputs of a multiplexer 508 receiving the control signal DTEST1. In response to the signal DTEST1, the multiplexer 508 applies the output of one of the NOR gates 500 and 504 to a first input of a multiplexer 510. The multiplexer 510 receives an error signal ERROR1 from an error detection circuit 512 on a second input, and transfers the signal applied on one of its two inputs to the data terminal DQ1 in response to the control signal DTEST2. The error detection circuit 512 operates in a manner analogous to the error detection circuits 400 and 402, previously described with reference to FIG. 4, to develop the error signal ERROR1 in response to the compressed data signals D2,$\overline{D2}$ and D5,$\overline{D5}$. In contrast to the error detection circuits 400 and 402, however, the error detection circuit 512 develops the single error signal ERROR1 on its output. In operation, when the data signals D2 and D5 are both high, and the complementary data signals $\overline{D2}$ and $\overline{D5}$ are accordingly both low, the error detection circuit 512 drives the error signal ERROR1 high. When the data signals D2 and D5 are both low, the error detection circuit 512 drives the error signal ERROR1 low. When the data signals D2,$\overline{D2}$ and D5,$\overline{D5}$ are all low, the error detection circuit 512 places its output in a high impedance state, indicating one of the memory cells having its data compressed to provide the data signals D2,$\overline{D2}$ and D5,$\overline{D5}$ is defective.

The second-stage error detection and multiplexer circuit 314 further includes a multiplexer 514 that transfers the output of one of the NOR gates 502 and 506 to its output in response to the signal DTEST1. A multiplexer 516 receives the output of the multiplexer 514 and an output from an error detection circuit 518. The error detection circuit 518 operates identically to the error detection circuit 512 in developing an error signal ERROR0 in response to the data signals D4,$\overline{D4}$ and D7,$\overline{D7}$. The multiplexer 516 transfers either the output of the multiplexer 514 or the error signal ERROR0 to the data terminal DQ0 in response to the test signal DTEST2.

The second-stage error detection and multiplexer circuit 314 operates in two modes, a full compression mode and a partial compression mode. For the following description, it is assumed the compressed data signals D1,$\overline{D1}$–D4,$\overline{D4}$, D5, $\overline{D5}$ and D7,$\overline{D7}$ represent data stored in the corresponding memory cells indicated for each pair of signals. For example, the signals D1,$\overline{D1}$ represent data stored in memory cells D24–D27. In the full compression mode, the test signal DTEST2 is high causing the multiplexer 510 to transfer the error signal ERROR1 to the data terminal DQ1 and the multiplexer 516 to transfer the error signal ERROR0 to the data terminal DQ0. The state of the test signal DTEST1 is irrelevant during the full compression mode of operation because the outputs of the multiplexers 508 and 514 are isolated by the multiplexers 510 and 516, respectively. During the full compression mode of operation, the error detection circuit 512 compares the binary values of die data signals D2,$\overline{D2}$ and D5,$\overline{D5}$. As indicated in FIG. 5, the signals D2,$\overline{D2}$ represent the data stored in the memory cells D16–D19 and the signals D5,$\overline{D5}$ represent the data stored the memory cells D0–D3. Thus, the error signal ERROR1 represents the data stored in the eight memory cells D0–D3 and D16–D19 in the memory bank 101a. The error detection circuit 518 operates in the same way to compare the data signals D4,$\overline{D4}$ and D7,$\overline{D7}$, which represent the data stored in memory cells D48–D51 and D32–D35, respectively, in the memory bank 101b. Thus, the error signal ERROR0 represents the data stored in the eight memory cells D32–D35 and D48–D51.

During the full compression mode of operation, the error detection circuits 512 and 518 independently compare data within the memory banks 101a and 101b. The error signal ERROR1 indicates whether there is a defective memory cell in memory bank 101a while error signal ERROR0 indicates if there is a defective memory cell in bank 101b. By independently compressing data within the banks 101a and 101b, the error signals ERROR1 and ERROR0 enable an external memory tester coupled to the SDRAM 100 to determine which of the memory banks 101a and 101b contains the defective memory cell. In contrast to the write compression mode, during the full compression mode data is not compressed across the redundancy plane between the banks 101a and 101b. This enables the repair of memory cells within the banks 101a and 101b to be performed independently, reducing the number of redundant rows required to repair such defective memory cells as previously described. The second-stage data compression and multiplexer circuit 316 operates identically to the circuit 314, to independently compare data within the memory banks 101a and 101b, and develop corresponding error signals on the data terminals DQ2 and DQ3.

During the partial compression mode of operation, the second-stage data compression and multiplexer circuit 314 operates as a multiplexer placing the results of data compressed by the first-stage data compression circuits 302 and 308 (see FIG. 3) on the data terminals DQ0 and DQ1. For the following description, the data signals D1,$\overline{D1}$–$\overline{D4}$, D5, $\overline{D5}$, and D7,$\overline{D7}$ represent the same data as during the full compression mode. In the partial compression mode, the test signal DTEST2 is low. In response to the low signal DTEST2, the multiplexer 510 isolates the signal ERROR1 and transfers the signal output by the multiplexer 508 to the data terminal DQ1. The multiplexer 516 operates in the same way to isolate the error signal ERROR0 and transfer the signal output by the multiplexer 514 to the data terminal DQ0. During the partial compression mode, the test signal DTEST1 determines which of the error signals output by the NOR gates 500–506 are placed on the terminals DQ0 and DQ1. When the test signal DTEST1 is low, the error signal output by the NOR gate 500 is transferred through the multiplexer 508 and then through the multiplexer 510 to the data terminal DQ1, and the error signal output by the NOR gate 502 is transferred through the multiplexer 514 and then through the multiplexer 516 to the data terminal DQ0. If the test signal DTEST1 is high, the error signal output by the NOR gate 504 is transferred through the multiplexer 508 and then through the multiplexer 510 to the data terminal DQ1, and the error signal output by the NOR gate 506 is transferred through the multiplexer 514 and then through the multiplexer 516 to the data terminal DQ0.

The partial compression mode of operation enables independent testing of the memory banks 101a and 101b. For example, when the test signal DTEST1 is low, the error signals output by the NOR gates 500 and 502 are placed on the data terminals DQ1 and DQ0, respectively. The error signals output by the NOR gate 500 and 502 indicate whether the accessed memory cells D16–D19 and D24–D27, respectively, in the memory bank 101a are defective. Thus, when the test signal DTEST1 is low, only the memory bank 101a need be activated since no compressed data from the memory bank 101b is being placed on the data terminals DQ0 and DQ1. As in the full compression mode, no data is compressed across the redundancy plane represented 232 between the banks 101a and 101b. The second-stage data compression and multiplexer circuit 316 operates identically to the circuit 314 during the partial compression mode of operation, placing error signals indicating the status of the memory cells from one of the memory banks 101a and 101b on the data terminals DQ2 and DQ3.

Figure 6:
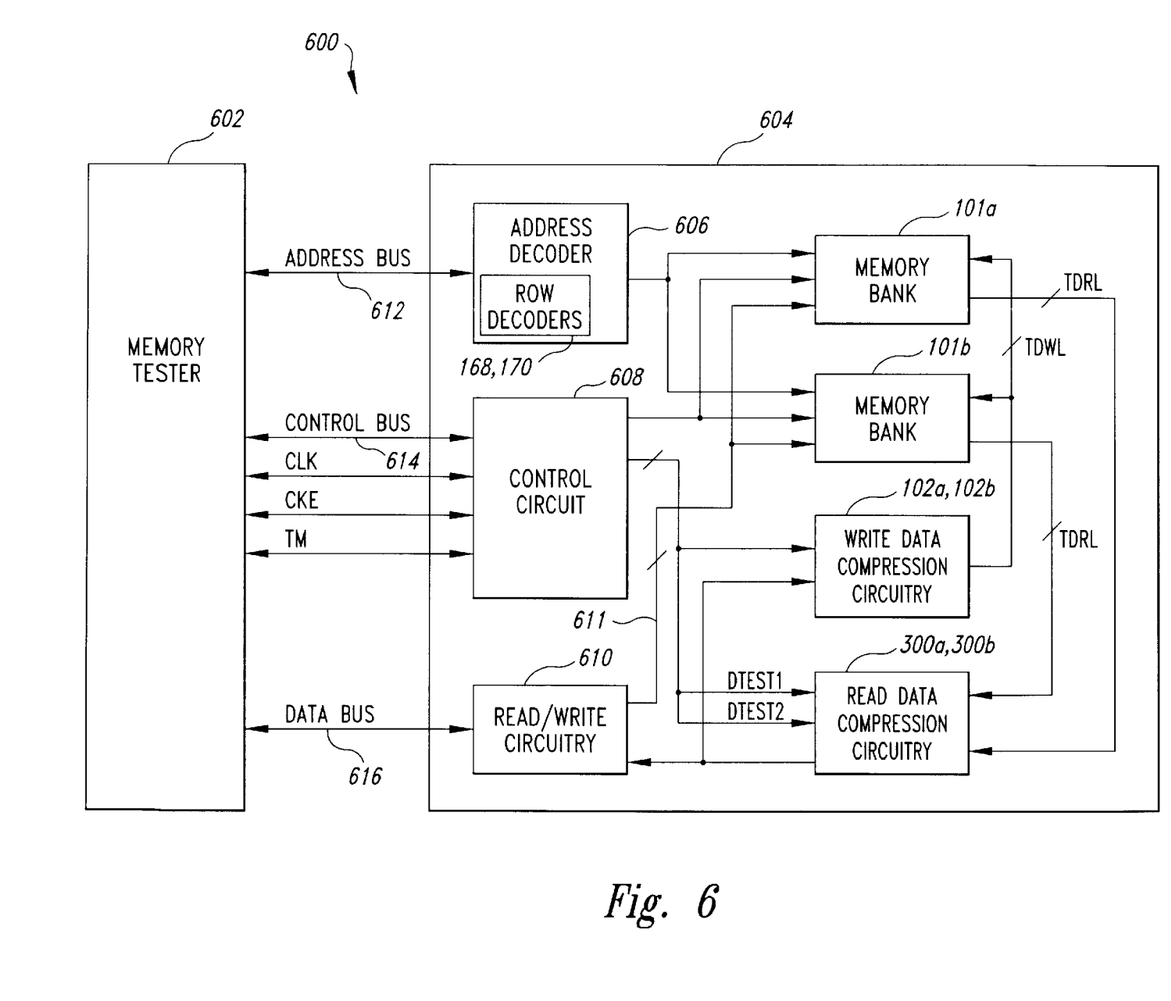
FIG. 6 is a block diagram of a test system including a memory device having the data compression circuitry of FIGS. 2 and 3.

FIG. 6 is a block diagram of a test system 600 including a memory tester 602 coupled to an SDRAM 604 including the write compression circuits 102a and 102b of FIG. 2, and the read compression circuits 300a and 300b of FIG. 3. The write compression circuits 102a,102b, are coupled to memory banks 101a and 101b through the test data write lines TDWL, and the read compression circuits 300a and 300b are coupled to the memory banks 101a and 101b through the test data read lines TDRL, as previously described. The SDRAM 604 further includes an address decoder 606 receiving address signals on an address bus 612 and applying decoded address signals to the memory banks 101a and 101b to activate addressed memory cells in those banks. The address decoder 606 includes the row decoders 168 and 170 previously described. A control circuit 608 receives a clock signal CLK, clock enable signal CKE, test mode signal TM, and control signals on a control bus 614. In response to these signals, the control circuit 608 controls die memory banks 101a and 101b, write compression circuits 102a,102b, and read compression circuits 300a,300b. A read/write circuit 610 is coupled to die memory banks 101a,101b through normal data read and write paths 611 and transfers data between a data bus 616 and the memory banks. The read/write circuit 610 is also coupled to the memory banks 101a,101b through the write and read compression circuits 102a,102b and 300a,300b and associated test data lines TDRL and TDWL.

The SDRAM 604 operates in two modes, a normal mode and a test mode. The SDRAM 604 typically operates in the normal mode outside of the test system 600. In the normal mode, an external circuit (not shown in FIG. 1), such as a microprocessor or a memory controller, drives the test mode signal TM inactive, activates the signal CKE, applies the clock signal CLK, and places address, data, and control signals on the buses 612–616, respectively. In response to the clock signal CLK, the control circuit 608 controls the address decoder 606, read/write circuit 610, and memory banks 101a and 101b to perform data transfer operations. During the data transfer operations, the external circuit places address, data, and control signals on the respective buses to form a command, such as an ACTIVE, READ, or WRITE command, as understood by one skilled in the art. The commands are typically latched by the SDRAM 604 in response to a rising edge of the clock signal CLK.

To initiate a data transfer command, the external circuit applies an ACTIVE command to the SDRAM 604, including a bank address and a row address that are latched by the address decoder 606 under control of the control circuit 608. The address decoder 606 decodes the bank address and activates the corresponding one of the memory banks 101a and 101b, and activates a row or rows of memory cells within the activated bank. During a read operation, the external circuit thereafter applies a READ command to the SDRAM 604 including a column address that is latched by the address decoder 606. The address decoder 606 decodes the latched column address and accesses corresponding memory cells in the activated arrays in memory bank 101a or 101b. The data stored in the accessed memory cells in the activated bank 101a or 101b is then over the normal data path 611 and through the read/write circuit 610 onto the data bus 616 where it is available to be read by the external circuit. During a write command, after an ACTIVE command is applied, the external circuit applies a WRITE command to the SDRAM 604. The WRITE command includes a column address placed on the address bus 612 and data placed on the data bus 616. The address decoder 606 once again decodes the latched column address and activates corresponding memory cells in the activated memory bank 101a or 101b. The read/write circuit 610 thereafter transfers the data placed on the data bus over the normal data path 611 to the addressed memory cells in the activated memory bank 101a or 101b where it is stored.

In the test mode of operation, the memory tester 602 applies data transfer commands to the SDRAM 604, as well as the clock signal CLK, clock enable signal CKE, and test mode signal TM. To place the SDRAM 604 in the test mode of operation, the memory tester 602 drives the test mode signal TM active. Although the test mode signal TM is shown as being applied on a single terminal of the SDRAM 604, one skilled in the art will realize that the test mode signal TM may take a variety of forms. For example, the test mode signal TM may correspond to a logic level signal or a "super voltage" applied to one of the pins of the SDRAM 604, or a combination of control signals on the control bus such as providing a column address strobe signal $\overline{CAS}$ before a row address strobe signal $\overline{RAS}$ to place the SDRAM 604 in the test mode of operation.

Before the memory tester 602 begins testing memory cells in the memory banks 101a and 101b, it must write a test data pattern to all memory cells in the memory banks. To write the test data to all memory cells, the memory tester 602 applies data transfer commands and the control circuit 608 controls the write compression circuits 102a,102b to simultaneously write test data placed on each terminal of the data bus 616 into a plurality of memory cells in the memory banks 101a and 101b, as previously described. Typically, the memory tester 602 writes test data having a first binary value (e.g., a "1") or a second binary value (e.g., a "0") to all memory cells in the banks 101a,101b. The write compression circuits 102a,102b enable the memory tester 602 to more quickly write test data into all the memory cells in the memory banks 101a and 101b since each bit of test data placed on a terminal of the data bus is written to a plurality of memory cells. In the embodiment of FIG. 2, a test data bit placed on each of the data terminals DQ0–DQ3 is simultaneously written to eight memory cells in the memory banks 101a and 101b as previously described. Thus one-eighth the conventional number of bus cycles is required to write test data to all the memory cells in the banks 101a and 101b.

After the test data has been written to the memory cells, the memory tester 604 applies READ commands to the SDRAM 604 and the control circuit 608 controls the read compression circuits 300a and 300b to compress the data stored in the accessed memory cells corresponding to the READ command. During the read test data mode of operation, the memory tester 602 may alternately place the second-stage data compression and multiplexer circuits 314 and 316 in full and partial compression modes. To determine the mode of the circuits 314 and 316, the external circuit may apply signals over the control bus 614 to the control circuit 608 which, in response to these signals, drives the test signals DTEST1 and DTEST2 to the appropriate levels to perform the desired compression. The error signals developed by the read compression circuits 300a and 300b are transferred through the read/write circuit 610 to the data bus 616 where they are read by the memory tester 602 to detect defective memory cells in the memory banks 101a and 101b.

Figure 7:
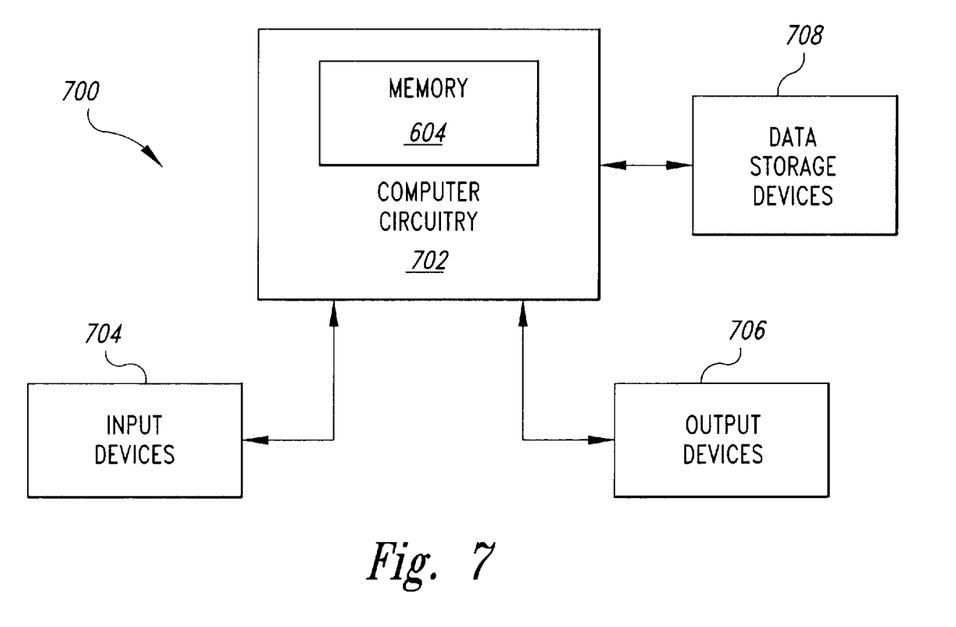
FIG. 7 is a functional block diagram of a computer system including the memory device of FIG. 6.

FIG. 7 is a block diagram of a computer system 700 including the SDRAM 604 of FIG. 6. The computer system 700 includes computer circuitry 702 for performing various computing functions, such as executing specific software to perform specific calculations or tasks. In addition, the computer system 700 includes one or more input devices 704, such as a keyboard or a mouse, coupled to the computer circuitry 702 to allow an operator to interface with the computer system 700. Typically, the computer system 700 includes one or more output devices 706 coupled to the computer circuitry 702, such output devices typically being a printer or a video terminal. One or more data storage devices 708 are also typically coupled to the computer circuitry 702 to store data or retrieve data from the external storage media (not shown in FIG. 7). Examples of typical data storage devices 708 include hard and floppy disks, tape cassettes, and compact disk read-only memories ("CD-ROMs"). The computer circuitry 702 is typically coupled to the SDRAM 604 through a control bus, a data bus, and an address bus to provide for writing data to and reading data from the SDRAM 604 as previously explained.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed is:

1. A test circuit in a memory device, the memory device including first and second memory banks having a redundancy plane defined between the two banks, each bank including at least one array of memory cells and the memory device including at least one data terminal, the test circuit comprising:
    a test mode terminal adapted to receive a test mode signal;
    a test data write path coupled across the redundancy plane defined between the two memory banks to a plurality of memory cells in the first and second banks; and
    a test data write circuit coupled to the test mode and data terminals, and to the test data write path, the test data write circuit operable in a test write mode when the test mode signal is active to transfer test data placed on the data terminal across the redundancy plane through the test data write path, storing the test data in a plurality of memory cells in the first and second banks.

2. The test circuit of claim 1 wherein the test data write circuit comprises a plurality of write drivers, each write driver having an input coupled to an associated data terminal and an output coupled to the test data write path.

3. The test circuit of claim 1 wherein the test data write path comprises a plurality of test data write lines.

4. A test circuit in a memory device, the memory device including first and second banks of memory cells having a redundancy plane defined between the two banks, and the memory device including at least one data terminal, the test circuit comprising:
    a test mode terminal adapted to receive a test mode signal;
    a test data write path coupled to a plurality of memory cells in the first and second banks;
    a first test data read path coupled to a plurality of memory cells in the first bank;
    a second test data read path coupled to a plurality of memory cells in the second bank;
    a test data write circuit coupled to the data terminal and to the test data write path, the test data write circuit transferring test data placed on the data terminal over the test data write path to a plurality of memory cells in the first and second banks;
    a test data read circuit coupled to the first and second test data read paths, the test data read circuit driving a first error signal active when data on the first test data read path is different from predetermined binary values and driving a second error signal active when data on the second test data read path is different from predetermined binary values; and
    a test control circuit coupled to the test mode terminal, and the test data read and write circuits, the test control circuit operable, when the test mode signal is active, in a write test mode to control the test data write circuit to transfer test data placed on the data terminal across the redundancy plane to accessed memory cells in the first and second banks, and operable in a read test mode to place data from accessed memory cells on at least one of the first and second test data read paths.

5. The test circuit of claim 4 wherein each of the test data read paths includes a plurality of test data read lines, and the test data write path includes a plurality of test data write lines.

6. The test circuit of claim 4 wherein the test data write circuit includes a plurality of write drivers, each write driver having an input coupled to an associated data terminal and an output coupled to the test data write path.

7. The test circuit of claim 4 wherein the test data read circuit comprises:
    first and second data compression circuits having inputs coupled to receive data signals from activated memory cells in the first bank, each of the first and second data compression circuits developing error signals responsive to the data signals;
    third and fourth data compression circuits having inputs coupled to receive data signals from activated memory cells in the second bank, each of the third and fourth data compression circuits developing error signals responsive to the data signals; and
    a fifth data compression circuit having inputs coupled to the first, second, third, and fourth data compression circuits, outputs coupled to respective data terminals, and a control terminal adapted to receive a control signal, the fifth data compression circuit operable, responsive to the control signal, in a first mode to transfer the error signals from the first or third data compression circuits to respective data terminals, and operable in a second mode to develop a first error signal on a data terminal responsive to error signals from the first and second data compression circuits, and to develop a second error signal on a data terminal responsive to error signals from the third and fourth data compression signals.

8. The test circuit of claim 7 wherein each of the first, second, third, and fourth data compression circuits comprises:
    a NAND gate having a plurality of inputs and an output;
    a NOR gate having a plurality of inputs coupled respectively to inputs of the NAND gate; and
    an inverter having an input coupled to the output of the NAND gate.

9. The test circuit of claim 7 wherein the fifth data compression circuit comprises:
    a first error detection circuit having inputs adapted to receive error signals from the first and second data compression circuits, and an output;
    a second error detection circuit having inputs adapted to receive error signals from the third and fourth data compression circuits, and an output;
    a first multiplexer having inputs coupled respectively to the first and third data compression circuits, an output, and a control terminal adapted to receive a first control signal;

a second multiplexer having inputs coupled respectively to the outputs of the first error detection circuit and the first multiplexer, an output coupled to a respective data terminal, and a control adapted to receive a second control signal;

a third multiplexer having inputs coupled respectively to the first and third data compression circuits, an output, and a control terminal adapted to receive the first control signal; and a fourth multiplexer having inputs coupled respectively to the outputs of the second error detection circuit and the third multiplexer, an output coupled to a respective data terminal and a control terminal adapted to receive the second control signal.

10. The test circuit of claim 4 wherein the control circuit operates in the test read mode to simultaneously access memory cells in the first and second banks and place the corresponding data on the first and second test data read paths, respectively.

11. A test circuit in a memory device formed in a semiconductor substrate, the memory device comprising:

first and second banks of memory-cell arrays formed in first and second regions of the substrate, respectively, each of the arrays including a plurality of memory cells, and a redundancy plane being defined between the two banks;

a plurality of data terminals formed in the first region of the substrate;

a plurality of address decoder circuits, each address decoder circuit coupled to associated arrays in one of the first and second banks and operable to access memory cells in the associated arrays responsive to address signals;

a test data write path including a plurality of test write driver circuits, multiple write driver circuits having their inputs coupled to a single data terminal, and each write driver circuit having its output coupled through a test data line disposed across the redundancy plane to memory cells in the first and second banks, the test, data write path operable in a test data write mode to compress data placed on a data terminal and transfer the compressed data to a plurality of memory cells in the first and second banks; and a test data read path including a plurality of read data compression circuits, each data compression circuit having inputs coupled to memory cells in one of the first and second banks and an output coupled to one of the data terminals, each data compression circuit operable in a test data read mode to compress read data from a plurality of memory cells within each bank and place an error on its output responsive to such compressed data.

12. The test circuit of claim 11 wherein the memory device includes four data terminals.

13. The test circuit of claim 11 wherein each bank includes two rows of memory-cell arrays.

14. A test circuit in a memory device formed in a semiconductor substrate, comprising:

first and second banks of memory-cell arrays, each bank including a plurality of arrays arranged in first and second rows, the arrays in the first and second banks formed in first and second regions of the substrate, respectively, the first and second regions located adjacent each other on the substrate;

a first data terminal positioned on the substrate adjacent the first row of arrays in the first bank;

a second data terminal positioned on the substrate adjacent the second row of arrays in the first bank;

a test mode terminal adapted to receive a test mode signal;

a first test data write path coupled to the arrays in the first rows of arrays in the first and second banks;

a second test data write path coupled to the arrays in the second rows of arrays in the first and second banks;

a first compression circuit coupled between the first data terminal and the first test data write path, the first compression circuit transferring test data placed on the first data terminal across the first test data write path to a plurality of accessed memory cells in the first rows of arrays in the first and second banks;

a second compression circuit coupled between the second data terminal and the second test data write path, the second compression circuit transferring test data placed on the second data terminal across the second test data write path to a plurality of accessed memory cells in the second rows of arrays in the first and second banks; and a control circuit coupled to the test mode terminal, first and second compression circuits, and the arrays, the control operable when the test mode signal is active to access memory cells in the arrays in the first and second banks such that test data placed on the first and second data terminals is transferred to the accessed memory cells in the first and second rows, respectively, in the first and banks.

15. The test circuit of claim 14 wherein each of first and second compression circuits comprises a plurality of write drivers, each write driver in the first compression circuit having an input coupled to the first data terminal and an output coupled to the first test data write path, and each write driver in the second compression circuit having an input coupled to the second data terminal and an output coupled to the second test data write path.

16. The test circuit of claim 14 wherein each of the test data write paths comprises a plurality of test data write lines.

17. A memory device, comprising:

an address bus;

a control bus;

a data bus;

a test mode terminal adapted to receive a test mode signal;

an address decoder coupled to the address bus;

a control circuit coupled to the control bus;

a read/write circuit coupled to the data bus;

first and second banks of memory cells having a redundancy plane defined between the two banks; and a test circuit, including,
a test mode terminal adapted to receive a test mode signal,
a test data write path coupled to a plurality of memory cells in the first and second banks,
a first test data read path coupled to a plurality of memory cells in the first bank,
a second test data read path coupled to a plurality of memory cells in the second bank,
a test data write circuit coupled to die data bus and to the test data write path, the test data write circuit transferring test data placed on the data bus over the test data write path to a plurality of memory cells in the first and second banks,
a test data read circuit coupled to the first and second test data read paths, the test data read circuit driving a first error signal active when data on the first test data read path is different from predetermined binary values and driving a second error signal active when data on the second test data read path is different from predetermined binary values, and a test control circuit coupled to the test mode terminal, and the test data read and write circuits, the test control circuit operable, when the test mode signal is active, in a write test mode to control the test data write circuit to transfer test data placed on the data bus across the redundancy plane to accessed memory cells in the first and second banks, and operable in a read test mode to place data from accessed memory cells on at least one of the first and second test data read paths.

18. The memory device of claim 17 wherein the memory device includes an SDRAM.

19. The memory device of claim 17 wherein each of the test data read paths includes a plurality of test data read lines, and the test data write path includes a plurality of test data write lines.

20. The memory device of claim 17 wherein the test data write circuit includes a plurality of write drivers, each write driver having an input coupled to an associated data terminal and an output coupled to the test data write path.

21. The computer system of claim 20 wherein the memory device includes an SDRAM.

22. A test system for detecting defects in a memory device, comprising:

a memory device including,
address, data and control buses to which an address decoder, read/write circuit, and control circuit are coupled, respectively,
a test mode terminal adapted to receive a test mode signal;
first and second banks of memory cells having a redundancy plane defined between the two banks, and
a test circuit, including,
a test mode terminal adapted to receive a test mode signal,
a test data write path coupled to a plurality of memory cells in the first and second banks,
a first test data read path coupled to a plurality of memory cells in the first bank,
a second test data read path coupled to a plurality of memory cells in the second bank,
a test data write circuit coupled to the data bus and to the test data write path, the test data write circuit transferring test data, placed on the data bus over the test data write path to a plurality of memory cells in the first and second banks,
a test data read circuit coupled to the first and second test data read paths, the test data read circuit driving a first error signal active when data on the first test data read path is different from predetermined binary values and driving a second error signal active when data on the second test data read path is different from predetermined binary values, and
a test control circuit coupled to the test mode terminal, and the test data read and write circuits, the test control circuit operable, when the test mode signal is active, in a write test mode to control the test data write circuit to transfer test data placed on the data bus across the redundancy plane to accessed memory cells in the first and second banks, and operable in a read test mode to place data from accessed memory cells on at least one of the first and second test data read paths; and a memory tester coupled to the address, data, and control buses of the memory device and to the test mode terminal, the memory tester activating the test mode signal to place the memory device into a test mode, storing a predetermined test pattern of data in the memory cells, and detecting a defective memory cell in the memory device when any of the error signals goes active.

23. The test system of claim 22 wherein the memory tester sequentially applies separate predetermined test patterns of data that are stored in the memory cells, the memory tester determining at least once after applying a respective test pattern and before applying a subsequent test pattern whether the error signal is active.

24. A computer system, comprising:
a data input device;
a data output device; and
computing circuitry coupled to the data input and output devices, the computing circuitry including a memory device including first and second banks of memory cells having a redundancy plane defined between the two banks, at least one data terminal, and a test circuit, the test circuit including,
a test mode terminal adapted to receive a test mode signal,
a test data write path coupled to a plurality of memory cells in the first and second banks,
a first test data read path coupled to a plurality of memory cells in the first bank,
a second test data read path coupled to a plurality of memory cells in the second bank,
a test data write circuit coupled to the data terminal and to the test data write path, the test data write circuit transferring test data placed on the data terminal over the test data write path to a plurality of memory cells in the first and second banks,
a test data read circuit coupled to the first and second test data read paths, the test data read circuit driving a first error signal active when data on the first test data read path is different from predetermined binary values and driving a second error signal active when data on the second test data read path is different from predetermined binary values, and
a test control circuit coupled to the test mode terminal, and the test data read and write circuits, the test control circuit operable, when the test mode signal is active, in a write test mode to control the test data write circuit to transfer test data placed on the data terminal across the redundancy plane to accessed memory cells in the first and second banks, and operable in a read test mode to place data from accessed memory cells on at least one of the first and second test data read paths.

25. A method of compressing test data to be written to memory cells in a memory device, the memory device including a data terminal and first and second memory banks having a redundancy plane defined between the two banks, each bank including at least one array of memory cells, the method comprising the steps of placing test data on the data terminal, compressing the test data placed on the data terminal, and transferring the compressed test data across the redundancy plane defined between the two memory banks to store the compressed data in a plurality of memory cells in the first and second banks.

26. The method of claim 25 wherein the compressed test data is simultaneously stored in the plurality of memory cells in the first and second banks.

27. The method of claim 25 wherein the step of placing includes placing the same binary value on the data terminal until compressed data is transferred to all memory cells in the first and second banks.

28. A method of testing memory cells in a memory device, the memory device including at least one data terminal and first and second memory banks having a redundancy plane defined between the two banks, each bank including at least one array of memory cells, the method comprising the steps of:

placing test write data on a respective data terminal;

compressing the test write data;

reading test data from a plurality of memory cells in at least one of the first and second banks;

compressing any test data read from the first bank;

detecting a defective memory cell in the first bark from any compressed test data read from the first bank;

compressing any test data read from the second bank;

detecting a defective memory cell in the second bank from any compressed test data read from the second bank; and placing error signals on respective data terminals in response to the steps of detecting.

29. The method of claim 28 wherein the step of storing includes the step of simultaneously storing the compressed write test data in the plurality of memory cells in the first and second banks.

30. The method of claim 28 wherein the step of placing includes placing the same binary value on the data terminal until compressed data is transferred to all memory cells in the first and second banks.

31. A method of testing memory cells in a memory device, the memory device including a data terminal and first and second banks of memory-cell arrays, the arrays in each bank arranged rows in columns and there being a redundancy plane defined between the two banks and redundancy planes defined between adjacent even and odd arrays in each row, the method comprising the steps of:

placing write test data on the data terminal;

compressing the write test data placed on the data terminal;

storing the compressed write test data in memory cells in the even and odd numbered arrays of the first and second banks;

reading test data from even-numbered arrays in the first and second banks;

compressing test data read from the even-numbered arrays in the first and second banks, respectively;

detecting defective memory cells in the even-numbered arrays of the first and second banks from the respective test data read from the even-numbered arrays;

reading test data from the odd-numbered arrays in the first and second banks;

compressing test data read from the odd-numbered arrays in the first and second banks, respectively; and detecting defective memory cells in the odd-numbered arrays of the first and second banks from the respective test data read from the odd-numbered arrays.

32. The method of claim 31 wherein there are two rows of arrays in each bank with eight arrays in each row, and wherein the step of storing the compressed write test data stores a bit of test data applied on a data terminal in four arrays in each of the first and second banks.

33. The method of claim 31 wherein there are two rows of arrays in each bank with eight arrays in each row, and wherein the step of compressing test data read from the odd-numbered arrays in the first and second banks, respectively, includes compressing test data read from four odd arrays in each row in the first bank and compressing test data read from four odd arrays in each row of the second bank, respectively.

34. The method of claim 31 wherein the step of placing includes placing the same binary value on the data terminal until compressed write test data is stored to all memory cells in the even and odd numbered arrays in the first and second banks.

35. The method of claim 31 wherein the step of storing includes the steps of simultaneously storing the compressed write test data in the even-numbered arrays in the first and second banks.

36. The method of claim 31 wherein the step of detecting includes placing an error signal on the data terminal in response to the step of compressing test data read.

* * * * *

UNITED STATES PATENT AND TRADEMARK OFFICE
CERTIFICATE OF CORRECTION

| | |
|---|---|
| PATENT NO. | : 6,163,863 |
| APPLICATION NO. | : 09/083956 |
| DATED | : December 19, 2000 |
| INVENTOR(S) | : Steven F. Schicht |

It is certified that error appears in the above-identified patent and that said Letters Patent is hereby corrected as shown below:

Column 15, Line 40-41  "banks, the test, data" -- banks, the test data --

Column 16, Line 60   "coupled to die data" -- coupled to the data --

Column 19, Line 13,
 after "compressed the test write data;" please add   -- transferring the compressed test data across the redundancy plane defined between the two memory banks to store the compressed data in a plurality of memory cells in the first and second banks; --

Column 19, Line 17   "in the first bark"   -- in the first bank --

Signed and Sealed this

Eighteenth Day of July, 2006

JON W. DUDAS
*Director of the United States Patent and Trademark Office*